US008610222B2

(12) United States Patent
Lin et al.

(10) Patent No.: US 8,610,222 B2
(45) Date of Patent: Dec. 17, 2013

(54) MEMS DEVICE WITH CENTRAL ANCHOR FOR STRESS ISOLATION

(75) Inventors: Yizhen Lin, Gilbert, AZ (US); Gary G. Li, Chandler, AZ (US); Andrew C. McNeil, Chandler, AZ (US); Todd F. Miller, Mechanicville, NY (US); Lisa Z. Zhang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 361 days.

(21) Appl. No.: 13/088,579

(22) Filed: Apr. 18, 2011

(65) Prior Publication Data

US 2012/0262026 A1 Oct. 18, 2012

(51) Int. Cl.
*H01L 27/14* (2006.01)
(52) U.S. Cl.
USPC .................................. 257/414; 257/E27.011
(58) Field of Classification Search
USPC .......... 257/414, 415, 416, 417, 418, E27.011, 257/E21.598
See application file for complete search history.

(56) References Cited

U.S. PATENT DOCUMENTS

| 5,025,346 | A | * | 6/1991 | Tang et al. .................. 361/283.1 |
| 6,508,124 | B1 | | 1/2003 | Zerbini et al. |
| 6,792,804 | B2 | | 9/2004 | Adams et al. |
| 7,258,008 | B2 | | 8/2007 | Durante et al. |
| 7,322,242 | B2 | | 1/2008 | Merassi et al. |
| 2007/0163346 | A1 | * | 7/2007 | Platt et al. .................. 73/504.16 |
| 2008/0196499 | A1 | * | 8/2008 | Li et al. ........................... 73/510 |
| 2008/0271532 | A1 | * | 11/2008 | Platt et al. .................. 73/504.12 |
| 2009/0140443 | A1 | * | 6/2009 | Hohlfeld et al. ............... 257/786 |
| 2010/0155861 | A1 | | 6/2010 | Zhang et al. |

\* cited by examiner

*Primary Examiner* — Bilkis Jahan
(74) *Attorney, Agent, or Firm* — Schmeiser, Olsen & Watts LLP; Lowell W. Gresham; Charlene R. Jacobsen

(57) ABSTRACT

A MEMS device (20) includes a proof mass (32) coupled to and surrounding an immovable structure (30). The immovable structure (30) includes fixed fingers (36, 38) extending outwardly from a body (34) of the structure (30). The proof mass (32) includes movable fingers (60), each of which is disposed between a pair (62) of the fixed fingers (36, 38). A central area (42) of the body (34) is coupled to an underlying substrate (24), with the remainder of the immovable structure (30) and the proof mass (32) being suspended above the substrate (24) to largely isolate the MEMS device (20) from package stress, Additionally, the MEMS device (20) includes isolation trenches (80) and interconnects (46, 50, 64) so that the fixed fingers (36), the fixed fingers (38), and the movable fingers (60) are electrically isolated from one another to yield a differential device configuration.

20 Claims, 6 Drawing Sheets

MEMS DEVICE WITH CENTRAL ANCHOR FOR STRESS ISOLATION

TECHNICAL FIELD OF THE INVENTION

The present invention relates generally to microelectromechanical systems (MEMS) devices. More specifically, the present invention relates to a MEMS device having a central anchor for stress isolation.

BACKGROUND OF THE INVENTION

Microelectromechanical systems (MEMS) devices are widely used in applications such as automotive, inertial guidance systems, household appliances, protection systems for a variety of devices, and many other industrial, scientific, and engineering systems. Such MEMS devices are used to sense a physical condition such as acceleration, pressure, or temperature, and to provide an electrical signal representative of the sensed physical condition.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Many microelectromechanical systems (MEMS) device applications require smaller size and lower cost packaging to meet aggressive cost targets. In addition, MEMS device applications are calling for tower temperature coefficient of offset (TCO) specifications. TCO is a measure of how much thermal stresses effect the performance of a semiconductor device, such as a MEMS device. A high TCO indicates correspondingly high thermally induced stress. The fabrication and packaging of MEMS device applications often uses various materials with dissimilar coefficients of thermal expansion. As the various materials expand and contract at different rates in the presence of temperature changes, the active transducer layer of the MEMS device may experience stretching, bending, warping and other deformations due to the different dimensional changes of the different materials. Thus, significant thermal stress, i.e., an undesirably high TCO, often develops during manufacture or operation.

In addition, stresses can result from soldering the packaged MEMS device onto a printed circuit board in an end application. These package stresses can change the strain of the substrate on which the MEMS sensor is mounted causing offset shifts, or displacements. Moreover, the substrate may undergo some non-constant strain such as non-uniform stretching, bending, or warping across a surface of the substrate. The displacement induced by package stress and substrate strain can cause changes in the sense signal, thus adversely affecting the output performance of the MEMS device.

Embodiments of the invention entail a MEMS device in which the MEMS device is largely isolated from the underlying substrate. This isolation is achieved by significantly reducing the connection of elements to the substrate, relative to prior art devices, and by locating the connections within close proximity to one another and at a centralized area of the substrate. In an embodiment, the MEMS device includes a high aspect ratio polysilicon structural layer of multiple sense fingers separated by isolation trenches that provide electrical isolation. Electrically conductive signal traces, referred to herein as interconnects, are used to connect various sense fingers together to the same electrical potential. The centralized configuration of anchors and the minimized quantity of anchors reduces the adverse effects of inconsistencies and irregularities of strain across the plane of the substrate. Furthermore, by utilizing isolation trenches with electrically conductive interconnects, the sense fingers can be placed in an alternating position to enable differential sensing for improved sensitivity. Thus, such a MEMS device is less susceptible to thermally induced package stress gradients, and can be readily implemented as a low cost, compact, differential sensing transducer.

Figure 1:
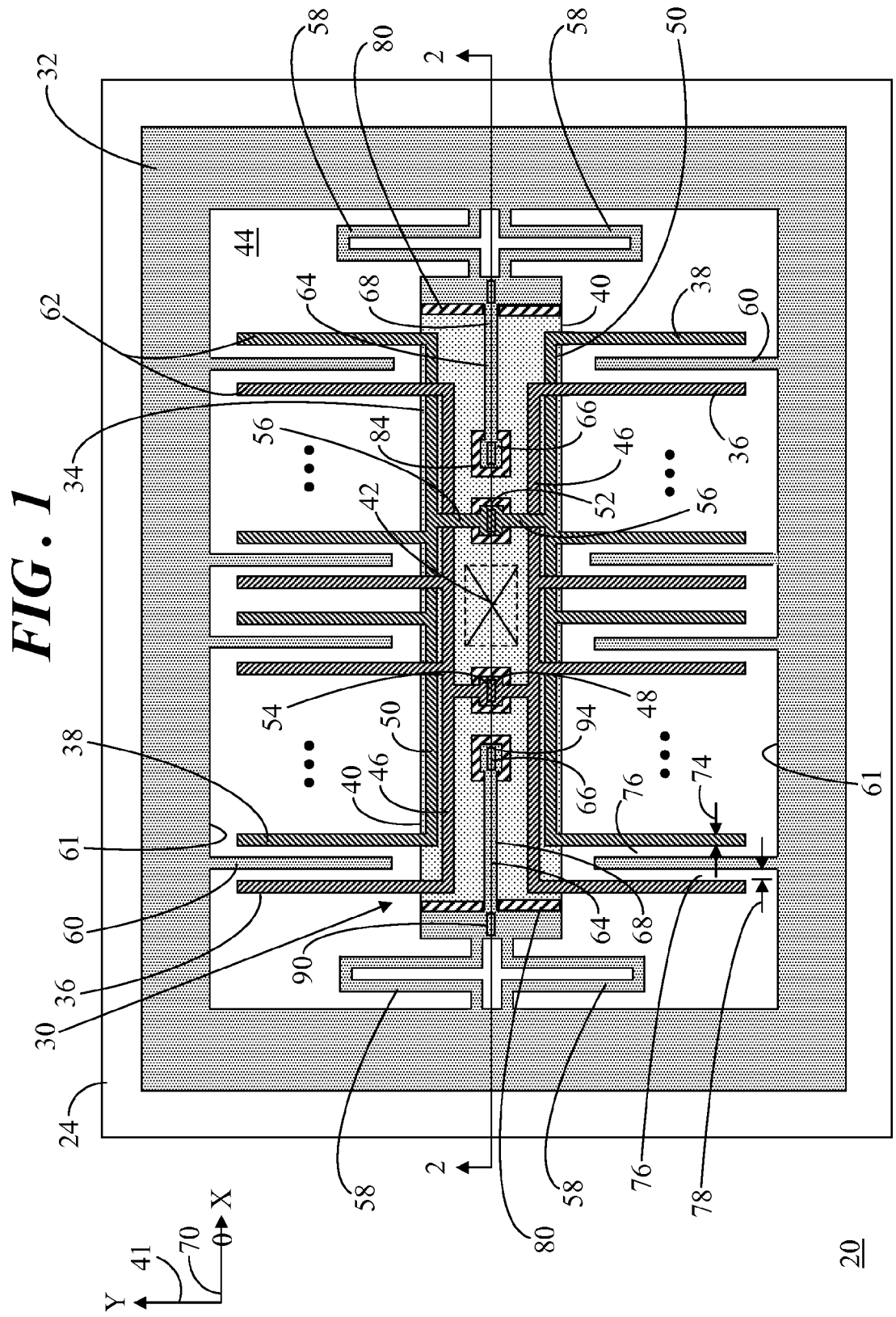
FIG. 1 schematically shows a top view of a microelectromechanical systems (MEMS) device in accordance with an embodiment.
Figure 2:
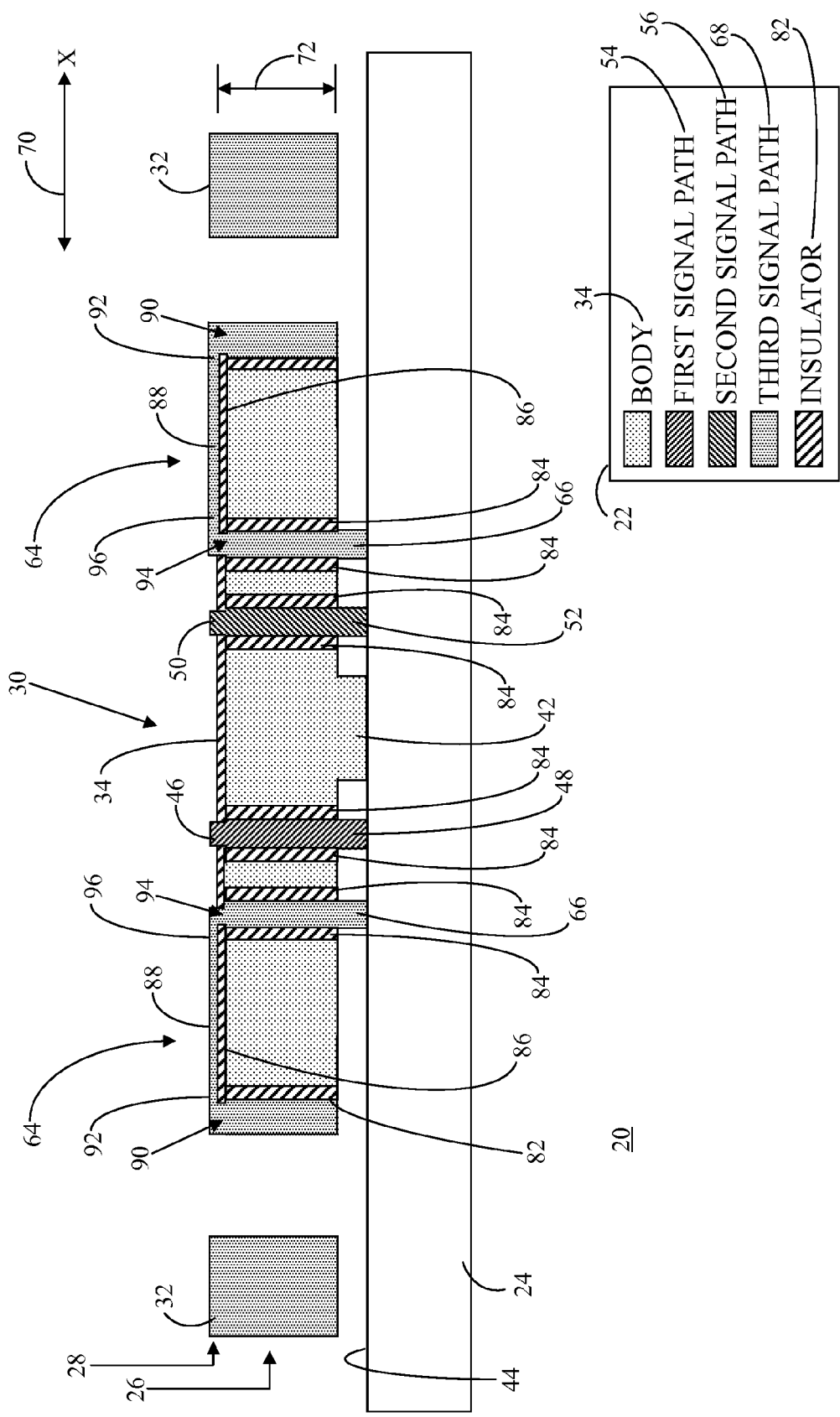
FIG. 2 shows a side view of the MEMS device along section lines 2-2 in FIG. 1.

Referring to FIGS. 1 and 2, FIG. 1 schematically shows a top view of a microelectromechanical systems (MEMS) device 20 in accordance with an embodiment. FIG. 2 shows a side view of MEMS device 20 along section lines 2-2 in FIG. 1. FIGS. 1 and 2 are illustrated using various shading and/or hatching to distinguish paths of electrical conductivity for the different elements produced within the structural layers of MEMS device 20, as will be discussed below. A legend 22 that includes an explanatory list of the elements and/or the patterns used to illustrate signal paths particular to each of the elements is provided in FIG. 2 for clarity of description. The different elements within the structural layers of MEMS device 20 may be produced utilizing current and upcoming surface micromachining techniques of deposition, patterning, etching, and so forth. Accordingly, although different shading and/or hatching is utilized in the illustrations, the different elements and interconnects within the structural layers are typically formed out of the same material, such as polysilicon, single crystal silicon, and the like.

The elements of MEMS device 20 (discussed below) may be described variously as being "attached to," "attached with," "coupled to," "fixed to," or "interconnected with," other elements of MEMS device 20. However, it should be understood that the terms refer to the direct or indirect physical connections of particular elements of MEMS device 20 that occur during their formation through patterning and etching processes of MEMS fabrication.

MEMS device 20 includes a substrate 24, a structural layer 26, and an interconnect layer 28. In an embodiment, elements formed in structural layer 26 include a first structure, referred to herein as an immovable structure 30, and a frame structure, referred to herein as a proof mass 32. In general, immovable structure 30 is anchored to substrate 24 so that it is considered immovable relative to substrate 24. In contrast, proof mass 32 is movably coupled to immovable structure 30 and is thus able to move relative to immovable structure 30, discussed below.

Immovable structure 30 includes a body 34. A plurality of fixed beams, referred to herein as first fixed fingers 36 and second fixed fingers 38 extend outwardly from an outer periphery 40 of body 34. First and second fixed fingers 36 and 38, respectively, are substantially parallel to surface 44 of substrate 24, and are oriented substantially parallel to the Y-axis, represented by an arrow 41. Immovable structure 30 may include a multiplicity of alternating first and second fixed electrode fingers 36 and 38 of which only a few are shown for clarity of illustration. Ellipses provided in FIG. 1 indicate that there can be any of a number of alternating first and second fixed fingers 36 and 38 in accordance with particular design requirements and size constraints.

A central area 42 (represented in FIG. 1 by a dashed line box with an "X" marked over the box) of body 34 is coupled to a surface 44 of the underlying substrate 24 with the remainder of immovable structure 30, including first and second fixed fingers 36 and 38, respectively, being suspended above surface 44. MEMS device 20 further includes first signal traces, referred to herein as first interconnects 46, formed in interconnect layer 28 that electrically connect each of first fixed fingers 36 to one another and to a first anchor element 48 positioned proximate central area 42. Similarly, second signal traces, referred to herein as second interconnects 50, are also formed in interconnect layer 28 and electrically connect each of second fixed fingers 38 to one another and to a second anchor element 52 positioned proximate central area 42. Each of first and second anchor elements 48 and 52, respectively, extend through body 34 of immovable structure 30 and couples to surface 44 of the underlying substrate 24.

As shown in FIGS. 1 and 2, body 34 is represented by light stippled shading. In addition, first fixed fingers 36, first interconnects 46, and first anchor element 48 are connected at the same electrical potential to form a first signal path 54 (represented by downwardly and rightwardly directed narrow hatching) to an embedded electrical connection (not visible) disposed on substrate 24. Second fixed fingers 38, second interconnects 50, and second anchor element 52 are connected at the same electrical potential to form a second signal path 56 (represented by upwardly and rightwardly narrow hatching) to another embedded electrical connection (not visible) disposed on substrate 24. The terms "first" and "second" used herein do not refer to an ordering or prioritization of elements within a countable series of elements. Rather, the terms "first," "second," "third," and so forth are used herein to distinguish similar or related elements, such as the fixed fingers 36 and 38, the signal paths 54 and 56, and so forth for clarity of discussion.

Proof mass 32 is suspended above substrate 24 and surrounds immovable structure 30. Proof mass 32 is coupled to immovable structure 30 via compliant members, referred to herein as springs 58 (visible in FIG. 1), Proof mass 32 includes a plurality of movable beams, referred to herein as movable electrode fingers 60, extending inwardly from an inner periphery 61 of proof mass 32. Movable electrode fingers 60 are oriented substantially parallel to surface 44 of substrate 24 and are oriented substantially parallel to Y-axis 41. Each movable finger 60 is disposed between a pair 62 of first and second fixed fingers 36 and 38, respectively.

MEMS device 20 further includes third signal traces, referred to herein as third interconnects 64, electrically connecting each of movable fingers 60 to one another and to third anchor elements 66 positioned proximate central area 42. Movable fingers 60, springs 58, third interconnects 64, and third anchor elements 66 are connected at the same electrical potential to form a third signal path 68 (represented by darker stippled shading) to embedded electrical connections (not visible) disposed on substrate 24. As will be discussed in detail below, the structure of MEMS device 20 enables the electrical isolation of each of first, second, and third signal paths 54, 56, and 68, respectively, from one another.

In the illustrated embodiment, MEMS device 20 may be an accelerometer having capacitive sensing capability. In general, springs 58 suspend proof mass 32 over substrate 24 in a neutral position parallel to substrate 22 until the selective application of force, due to some other means, causes deflection or movement of proof mass 32. By way of example, proof mass 32 of MEMS device 20 moves when MEMS device 20 experiences acceleration substantially parallel to an X-axis 70. Lateral movement of proof mass 32 relative to X-axis 70 may be detected by each pair 62 of first and second fixed electrode fingers 36 and 38 interleaved with one of movable electrode fingers 60 of proof mass 32, as known to those skilled in the art. This lateral movement can subsequently be converted via electronics (not shown) into a signal having a parameter magnitude (e.g. voltage, current, frequency, etc.) that is dependent on the acceleration. In this example, MEMS device 20 may be a single axis accelerometer for detection of lateral movement in X-direction 70. However, alternative embodiments may entail dual axis accelerometers or other MEMS sensing devices.

Immovable structure 30 with first and second fixed fingers 36 and 38 and proof mass 32 with movable fingers 60 are formed in structural layer 26. Structural layer 26 may be, for example, a polysilicon structure layer having a height 72 between, for example, two and fifty microns. In an embodiment, height 72 may be approximately twenty five microns. Additionally, fingers 36, 38, and 60 exhibit a width 74 and gaps 76 between each of first and second fixed fingers 36 and 38 and corresponding movable fingers 60 exhibits a width 78. Widths 74 and 78 may be less than five microns, e.g., approximately two microns. Preferred height 72 and widths 74 and 78 are determined by the application and desired sensitivity.

When width 74 of fingers 36, 38, and 60 is approximately two microns, beams 36, 38, and 60 have a high aspect ratio (a ratio of height 72 to width 74) of 12:1 in this exemplary embodiment. Likewise, when width 78 is approximately two microns, gaps 76 between movable fingers 60 and first and second fixed fingers 36 and 38 has a high aspect ratio (the ratio of height 72 to width 78) of 12:1. The high aspect ratio provides an increase in surface area between movable fingers 60 and first and second fixed fingers 36 and 38, and thus a larger sense capacitance. The increased sense capacitance also provides an increased signal-to-noise ratio. In addition, the high vertical aspect ratio of immovable structure 30 and proof mass 32 yields a relatively larger mass and larger moment of inertia, and consequently reduced thermal noise.

In an embodiment, MEMS device 20 includes isolation trenches 80 extending entirely through height 72 of polysilicon structural layer 26. Isolation trenches 80 may be formed at opposing ends of body 34 of immovable structure 30. Springs 58 are laterally anchored to at least one of isolation trenches 80. Additionally, isolation trenches 80 may be formed along outer periphery 40 of body 34 (best seen in FIG. 3). As such, each of first and second fixed fingers 36 and 38, respectively, are laterally anchored to at least one of isolation trenches 80. Isolation trenches 80 are filled with an insulating material 82. In an embodiment, this insulating material 82 may be, for example, a nitride, such as silicon nitride, or an oxide, such as silicon oxide. Accordingly, isolation trenches 80 electrically isolate first fixed fingers 36, second fixed fingers 38, and movable fingers 60 from one another.

In the illustrated embodiment, isolation rings 84 surround each of first, second, and third anchor elements 48, 52, and 66, respectively. Like isolation trenches 80, isolation rings 84 are filled with insulating material 82, such as silicon nitride. Accordingly isolation rings 84 electrically isolate anchor elements 48, 52, and 66 from body 34 of immovable structure 30. Insulating material 82 of isolation trenches 80 and isolation rings 84 is represented by downwardly and rightwardly directed wide hatching.

Isolation trenches 80 can additionally provide a bridge to support electrical contacts, between certain elements of MEMS device 20. For example, proof mass 32 is electrically connected to third anchor element 66 via springs 58 and electrical signal traces, such as third interconnects 64. More specifically, third interconnect 64 includes a trace structure having an insulating layer 86 and a conductive layer 88. Insulating layer 86 is formed from insulating material 82. Hence, insulating layer 86 is also represented by downwardly and rightwardly directed wide hatching.

A first via 90 at a first end 92 of the trace structure electrically couples proof mass 32 with conductive layer 88. A second via 94 at a second end 96 of the trace structure overlying third anchor element 66 electrically couples the underlying anchor element 66 with conductive layer 88. However, immovable structure 30 is isolated from the conduction path by isolation trenches 80 and isolation ring 84, as well as insulating layer 86 interposed between body 34 and conductive layer 88 of third interconnect 64. First and second interconnects 46 and 50 are formed similarly, and bridge appropriate isolation trenches 80 and isolation rings 84 to provide the needed electrical connections.

Figure 3:
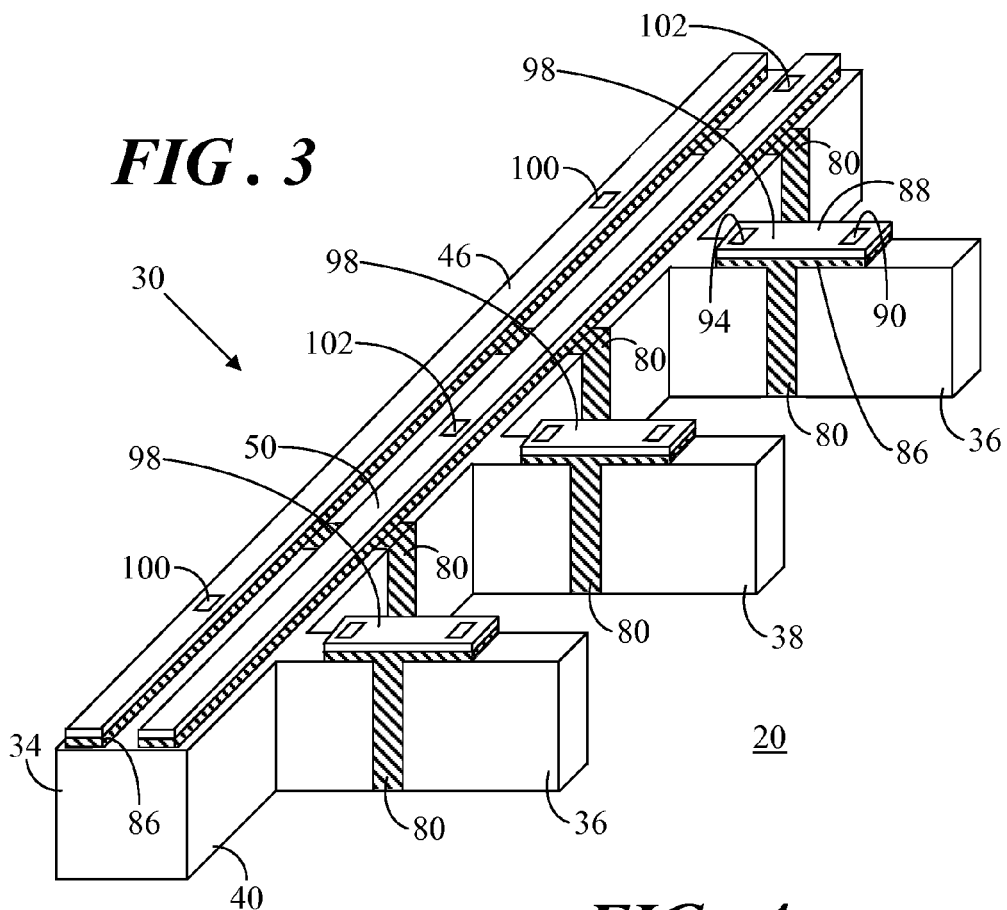
FIG. 3 shows a perspective view of a portion of the MEMS device.

FIG. 3 shows a perspective view of a portion of MEMS device 20. More particularly, FIG. 3 shows a portion of immovable structure 30 including two of first fixed fingers 36 and one of second fixed fingers 38. In this example, isolation trenches 80 are formed along outer periphery 40 of body 34, and each of first and second fixed fingers 36 and 38, respectively, are laterally anchored to at least one of isolation trenches 80. As shown, additional isolation trenches 80 may also extend through body 34 to further electrically isolate first and second fixed fingers 36 and 38.

In FIG. 3, electrical connections 98 bridge isolation trenches 80 to which first and second fixed fingers 36 and 38 are laterally anchored. Each of electrical connections 98 includes insulating layer 86, conductive layer 88, first via 90 (represented by a rectangle), and second via 94 (represented by a rectangle). A conduction path is formed from one of first and second fixed fingers 36 and 38 through first via 90, through conductive layer 88 bridging isolation trench 80, through via 94, and to a portion of body 34 isolated by the additional isolation trenches 80 in body 34.

FIG. 3 further shows a portion of first and second interconnects 46 and 50, respectively. First interconnect 46 includes vias 100 (represented by rectangles), and second interconnect 50 includes vias 102 (represented by rectangles). As previously described, each of first and second interconnects 46 and 50 includes insulating layer 86 interposed between body 34 and respective first and second interconnects 46 and 50. Vias 100 and 102 represent those locations where the underlying insulating layer 86 is absent or otherwise breached. Thus, vias 100 electrically couple each of first fixed fingers 36 to first interconnect 46, while the adjacent second fixed fingers 38 are electrically isolated from first fixed fingers 36. Likewise, vias 102 electrically couple each of second fixed fingers 38 to second interconnect 50, while the adjacent first fixed fingers 36 are electrically isolated from second fixed fingers 38.

Figure 4:
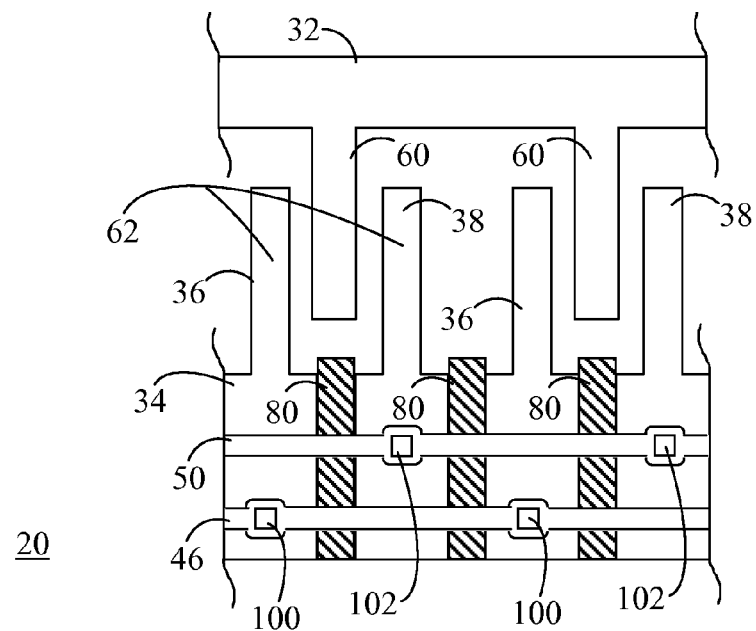
FIG. 4 shows an enlarged top view of a portion of the MEMS device.

FIG. 4 shows an enlarged top view of a portion of MEMS device 20 in accordance with another embodiment. As shown, one of moveable fingers 60 extending from proof mass 32 is disposed between each pair 62 of first and second fixed fingers 36 and 38. In this example, isolation trenches 80 are not formed along outer periphery 40 of body 34, and each of first and second fixed fingers 36 and 38, respectively, is not laterally anchored to at least one of isolation trenches 80. Rather, isolation trenches 80 extending through body 34 electrically isolate first and second fixed fingers 36 and 38. First interconnect 46 with vias 100 electrically couple each of first fixed fingers 36 with one another. Likewise, interconnect 50 with vias 102 electrically couple each of second fixed fingers 38 with one another.

Figure 5:
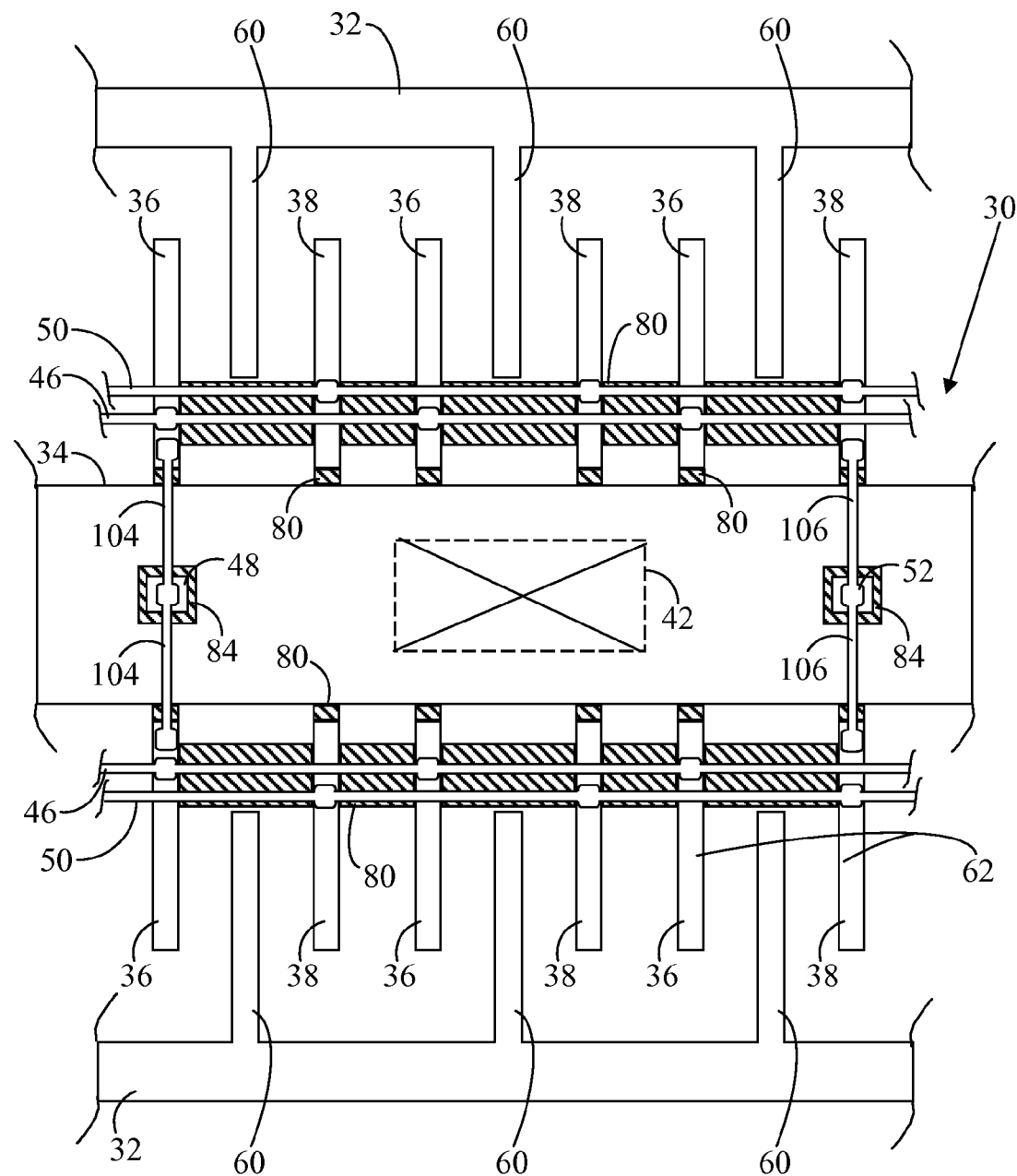
FIG. 5 shows an enlarged top view of a portion of the MEMS device.

FIG. 5 shows another enlarged top view of a portion of MEMS device 20. Again, one of moveable fingers 60 extending from proof mass 32 is disposed between each pair 62 of first and second fixed fingers 36 and 38. Isolation trenches 80 are formed along outer periphery 40 of body 34, so that each of first and second fixed fingers 36 and 38, respectively, is laterally anchored to at least one of isolation trenches 80. In this example, isolation trenches 80 underlie first and second interconnects 46 and 50 to provide a bridge for interconnects 46 and 50. In addition, isolation trenches 80 are coupled to first and second fixed fingers 36 and 38 to provide mechanical rigidity for immovable structure 30.

Electrical connections 104 bridge isolation ring 84 to electrically couple first interconnects 46 with first anchor element 48. Likewise, electrical connections 106 bridge isolation ring 84 to electrically couple second interconnects 50 with second anchor element 52.

MEMS device 20 having suspended immovable structure 30 and proof mass 32, and having a high aspect ratio polysilicon structural layer 26 (FIG. 1) of multiple sense finger 36 and 38 separated by isolation trenches 80 that provide electrical isolation may be produced using surface micromachining techniques. A surface micromachining technique may entail the deposition, patterning, and etching of various insulating layers, sacrificial layers, polysilicon layers, and interconnect layers, and so forth in accordance with known and upcoming techniques. In particular, structural layer 26 (FIG. 1) may be formed using various known and upcoming processes for thick film deposition. Isolation trenches 80 can then be formed in structural layer 26 by etching through the entire thickness of structural layer 26 using, for example, polysilicon deep reactive-ion etching (DRIE) to form openings extending through structural layer 26. Insulating material 82 (FIG. 2), such as a nitride, can then be deposited in one or more operations to entirely fill the openings.

Insulating layer 86 can then be deposited over the top surface of structural layer 26 to electrically insulate various regions of structural layer 26 from one another. Insulating layer 86 may be removed by etching in order to form the various vias 90, 92, 100, 102 in accordance with the particular design and function of MEMS device 20. Conductive material can then be deposited over insulating layer 82 to fill vias 90, 92, 100, and 102. The conductive material may be doped silicon, doped germanium, or one of various metals (i.e. aluminum, copper, molybdenum, tantalum, titanium, nickel, tungsten), or any other suitably conductive material. The conductive material is then appropriately patterned and etched to yield interconnect layer 28 (FIG. 1) that includes the signal traces, e.g., first, second, and third interconnects 46, 50, 64, as well as electrical connections 98. Next, etching is performed to remove the appropriate sacrificial layers so that immovable structure 30 and proof mass 32 are suspended above substrate 24 with the remaining connection points being at central area 42 (FIG. 1) and anchor elements 48, 52, and 66 (FIG. 1). Accordingly, proof mass 32 and movable electrode fingers 60 are now movably suspended, but are electrically isolated from the elements of immovable structure 30 via isolation trenches 80 in accordance with a particular design of MEMS device 20.

Figure 6:
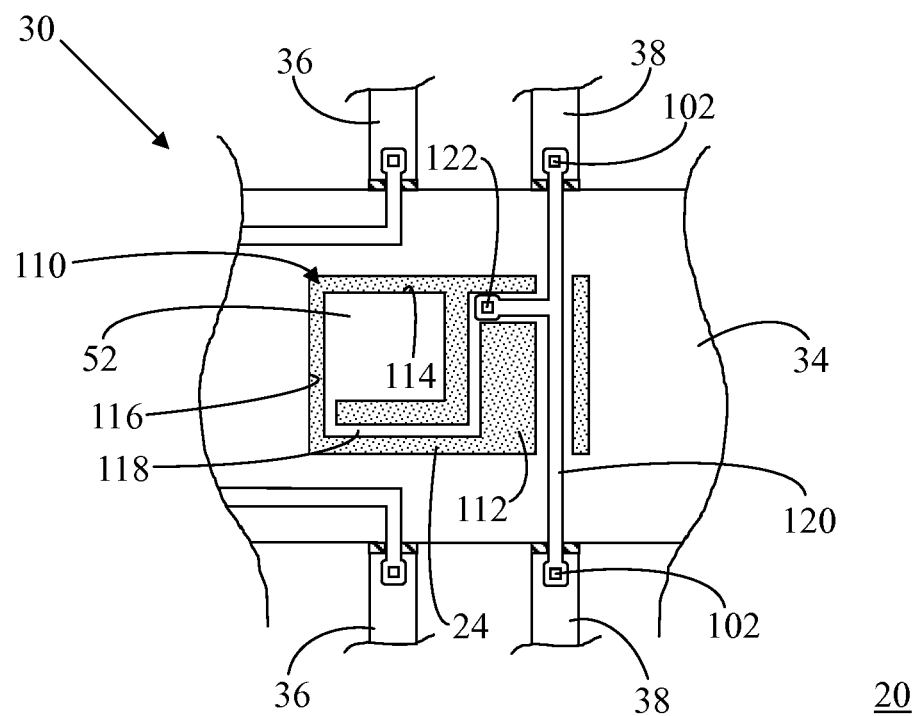
FIG. 6 shows a top view of an anchor region of the MEMS device.

FIG. 6 shows atop view of an anchor region 108 of MEMS device 20 in accordance with an alternative embodiment. MEMS device 20 is described above in which each of first and second anchor elements 46 and 52 extends through body 34 of immovable structure 30 and couples to the underlying substrate 24. Isolation ring 84 (FIG. 2) fills a gap between each of anchor elements 46 and 52 and the surrounding portion of body 34 in order to provide electrical isolation between the anchor element 46 or 52 and body 34.

Anchor elements 46 and 52 may move relative to body 34 due to, for example, deformation of substrate 24 where anchor elements 46 and 52 couple to substrate 24. This deformation could result in the imposition of stress on body 34 of immovable structure 30. In this alternative embodiment, a stress relief feature is included to mitigate problems due to stress. This alternative embodiment is described in connection with second anchor element 52. However, the following discussion applies equivalently to first anchor element 46.

Second anchor element 52 resides in an aperture 110 extending through body 34. Second anchor element 52 is sized such that a gap region 112 is formed between outer side surfaces 114 of second anchor element 52 and inner side surfaces 116 of body 34. As shown in FIG. 6, the underlying substrate 24 (represented by a stippled pattern) is visible through gap region 112. A compliant member 118 resides in gap region 112 and is interconnected between second anchor element 52 and body 34. Compliant member 118 enables movement of second anchor element 52 independent from body 34 due to, for example, deformation of substrate 24 so that stress is not transferred to body 34 of immovable element 30.

An electrical connection 120 includes vias 102 electrically coupled to second fixed fingers 38. Additionally, electrical connection 120 includes a via 122 electrically coupled to compliant member 118 to provide electrical coupling of second fixed fingers 38 with second anchor element 52.

Figure 7:
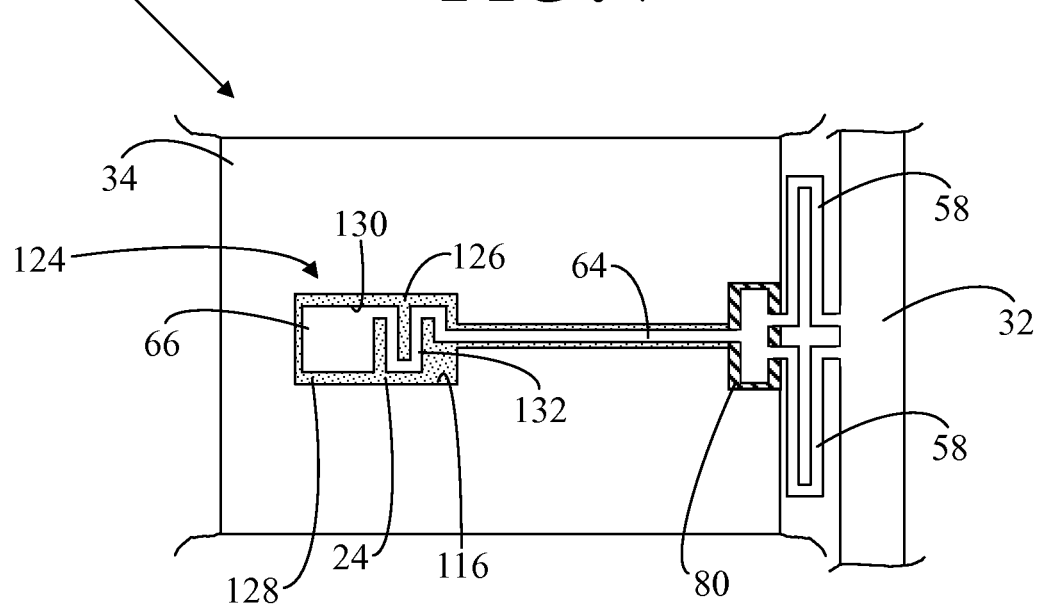
FIG. 7 shows a top view of another anchor region of the MEMS device.

FIG. 7 shows a top view of another anchor region 124 of MEMS device 20. Like first and second anchor elements 46 and 52, respectively, third anchor elements 66 are presented above with isolation ring 84 (FIG. 2) filling a gap between each of third anchor elements 66 and the surrounding portion of body 34 in order to provide electrical isolation. However, like anchor elements 46 and 52, anchor elements 66 may also move relative to body 34 resulting in the imposition of stress on body 34 of immovable structure. This alternative embodiment also includes a stress relief feature to mitigate problems due to stress. This stress relief feature applies equivalently to both of third anchor elements 66.

Third anchor element 66 resides in an aperture 126 extending through body 34. Third anchor element 66 is sized such that a gap region 128 is formed between outer side surfaces 130 of third anchor element 66 and inner side surfaces 116 of body 34. As shown in FIG. 7, the underlying substrate 24 (represented by a stippled pattern s visible through gap region 128. A compliant member 132 resides in gap region 128. Compliant member 132 is physically and electrically connected to each of third anchor element 66 and third interconnect 64. Third interconnect 64 extends to and couples with isolation trenches 80 formed in body 34. Thus, third interconnect 64 is coupled to but electrically isolated from body 34. Compliant member 132 enables movement of third anchor element 66 due to, for example, deformation of substrate 24 so that stress is not transferred to body 34 of immovable element 30.

Figure 8:
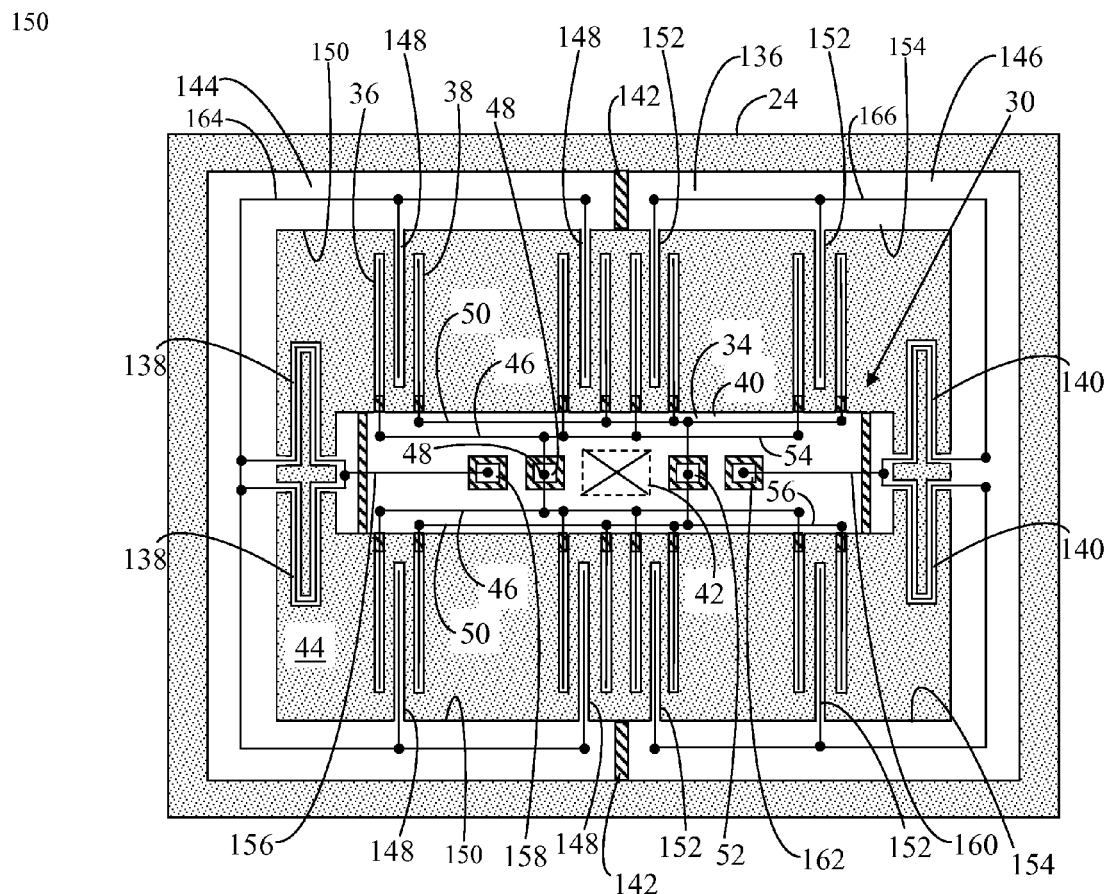
FIG. 8 shows a top view of a MEMS device in accordance with another embodiment.

FIG. 8 shows a top view of a MEMS device 134 in accordance with another embodiment. MEMS device 134 is similar to MEMS device 20 (FIG. 1). As such, elements common to both of MEMS devices 20 and 134 share the same reference numerals. For example, MEMS device 20 includes immovable structure 30 with body 34, as well as first and second fixed fingers 36 and 38 extending outwardly from outer periphery 40 of body 34. Central area 42 of body 34 is coupled to surface 44 of the underlying substrate 24 (represented by a stippled pattern) with the remainder of immovable structure 30, including first and second fixed fingers 36 and 38, respectively, being suspended above surface 44. First signal traces, i.e., first interconnects 46, electrically couple each of first fixed fingers 36 to one another and to first anchor element 48 positioned proximate central area 42. Similarly, second signal traces, i.e., second interconnects 50, electrically couple each of second fixed fingers 38 to one another and to second anchor element 52 positioned proximate central area 42.

A frame structure, referred to herein as a proof mass 136 is suspended above substrate 24 and surrounds immovable structure 30. Proof mass 136 is coupled to immovable structure 30 via first springs 138 and second springs 140. A pair of isolation trenches 142 extends through proof mass 136 to form a first mass section 144 and a second mass section 146 of proof mass 136. First and second mass section 144 and 146 are physically connected to yield the frame structure of proof mass 136, but are electrically isolated from one another due to the inclusion of isolation trenches 142. A first set of movable beams, referred to herein as first movable fingers 148 extend inwardly from a first inner periphery 150 of first mass section 144, and a second set of movable beams, referred to herein as second movable fingers 152 extend inwardly from a second inner periphery 154 of second mass section 146. Each of movable fingers 148 and 152 is disposed between a pair 62 of first and second fixed fingers 36 and 38, respectively.

MEMS device 134 further includes third signal traces, referred to herein as third interconnects 156, electrically coupling each of first movable fingers 148 to one another and to a third anchor element 158 positioned proximate central area 42. Fourth signal traces, referred to herein as third interconnects 160, electrically couple each of second movable fingers 152 to one another and to a fourth anchor element 162 positioned proximate central 42. Third and fourth anchor element 158 and 162, respectively, are electrically isolated from one another. Accordingly, first movable fingers 148 of first mass section 144, first springs 138, third interconnects 156, and third anchor element 158 are connected at the same electrical potential to form a third signal path 164 to embedded electrical connections (not visible) disposed on substrate 24. Whereas, second movable fingers 152 of second mass section 146, second springs 140, fourth interconnects 160, and fourth anchor element are connected at the same electrical potential to form a fourth signal path 166 to embedded electrical connections (not visible) disposed on substrate 24.

MEMS device 20 (FIG. 1) is embodied as a single-ended half-bridge configuration. In general, change in capacitance can be measured by driving each of fixed fingers 36 and 38 of MEMS device 20, and taking movable finger 60 (FIG. 1) as the output. In contrast, the structure of MEMS device 134 enables the electrical isolation of each of first, second, third, and fourth signal paths 54, 56, 164, and 166, respectively, from one another. As such, MEMS device 134 is a fully differential transducer. The sensitivity of a fully differential full-bridge capacitive sensor, such as MEMS device 134, may approximately double the sensitivity of the half-bridge topology. Therefore, significant gains can be achieved in terms of improved signal-to-noise ratio.

Figure 9:
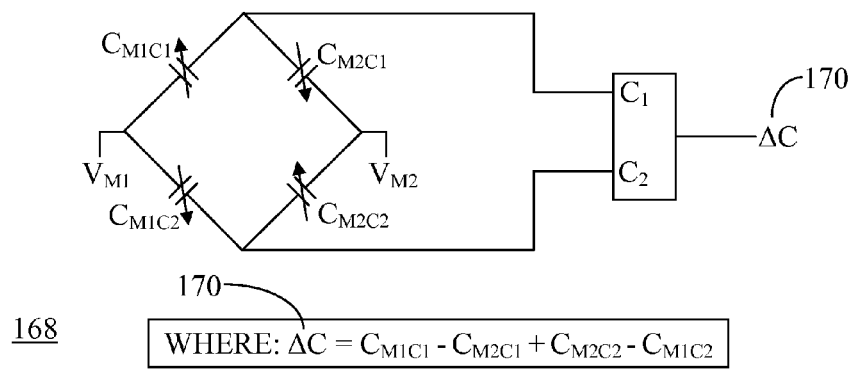
FIG. 9 shows a circuit diagram for the MEMS device of FIG. 8.

Referring to FIG. 9 in connection with FIG. 8, FIG. 9 shows a circuit diagram 168 for MEMS device 134. More particularly, circuit diagram 168 represents capacitive output 170, ΔC, of the full-bridge configuration of MEMS device 134. In the fully differential, full-bridge capacitive configuration of MEMS device 134, capacitive output 170 is a function of four capacitances, shown as $C_{M1C1}$, $C_{M2C1}$, $C_{M2C2}$, and $M_{M1C2}$.

In summary, embodiments entail a MEMS device in which the MEMS device is largely isolated from the underlying substrate. This isolation is achieved by suspending the fixed electrode fingers and the movable proof mass, thereby significantly reducing the connection of elements to the substrate, relative to prior art devices. In addition, the connection points are in close proximity to one another and close to the central area of the substrate. The centralized configuration of anchors and the minimized quantity of anchors reduces the adverse effects of inconsistencies and irregularities of strain across the plane of the substrate (package stress) on the MEMS device. Furthermore, the MEMS device is connected in one mechanical piece that includes a structural layer of multiple sense fingers separated by isolation trenches for electrical isolation. Electrically conductive interconnects are used to connect various sense fingers together to the same electrical potential. By utilizing isolation trenches with conductive interconnects, the sense fingers can be placed in an alternating position to enable differential sensing for improved sensitivity. Thus, such a centrally anchored MEMS device is less susceptible to thermally induced package stress gradients, and can be readily implemented as a low cost, compact, differential sensing transducer.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A microelectromechanical systems (MEMS) device comprising:
   a substrate;
   a first structure including a body and fixed fingers extending outwardly from an outer periphery of said body, wherein a central area of said body is coupled to said substrate and a remainder of said first structure is suspended over said substrate;
   a frame structure surrounding said first structure and suspended over said substrate, said frame structure being movably coupled to said first structure, said frame structure including a movable finger extending inwardly from an inner periphery of said frame structure, said movable finger being disposed between a pair of said fixed fingers;
   an anchor element extending through said body of said first structure and coupled to said substrate; and
   a signal trace electrically connecting said frame structure to said anchor element, and said frame structure, said signal trace, and said anchor element being electrically isolated from said first structure.

2. A MEMS device as claimed in claim 1 wherein said pair of fixed fingers includes a first fixed finger and a second fixed finger, and said MEMS device further comprises at least one isolation trench extending through said first structure, said at least one isolation trench electrically isolating said first fixed finger from said second fixed finger.

3. A MEMS device as claimed in claim 2 wherein said anchor element is a first anchor element, said signal trace is a first signal trace, and said MEMS device further comprises:
   a second anchor element extending through said body of said first structure proximate said central area and coupled to said substrate;
   a second signal trace electrically connecting said first fixed finger to said second anchor element;
   a third anchor element extending through said body of said first structure proximate said central area and coupled to said substrate; and
   a third signal trace electrically connecting said second fixed finger to said third anchor element, wherein said third anchor element and said third signal trace are electrically isolated from said second anchor element and said second signal trace.

4. A MEMS device as claimed in claim 3 wherein:
   said first structure includes multiple pairs of said fixed fingers extending outwardly from said outer periphery of said body;
   said frame structure includes multiple movable fingers extending inwardly from said inner periphery of said frame structure, each of said movable fingers being disposed between one of said multiple pairs of said fixed fingers;
   said second signal trace electrically connects said first finger of each of said pairs of said fixed fingers to said second anchor element; and
   said third signal trace electrically connects said second finger of said each of said pairs of said fixed fingers to said third anchor element.

5. A MEMS device as claimed in claim 1 further comprising isolation trenches extending through said first structure between said body and said fixed fingers such that each of said fixed fingers is laterally anchored to one of said isolation trenches, said isolation trenches including an insulator material.

6. A MEMS device as claimed in claim 5 further comprising:
   a second anchor element extending through said body proximate said central area and coupled to said substrate;
   a third anchor element extending through said body proximate said central area and coupled to said substrate, said third anchor element being electrically isolated from said second anchor element;
   a first electrical connection overlying at least one of said isolation trenches and electrically connecting a first finger of said pair of fixed fingers to said second anchor element; and
   a second electrical connection overlying another of said isolation trenches and electrically connecting a second finger of said pair of fixed fingers to said third anchor element, said second electrical connection being electrically isolated from said first electrical connection.

7. A MEMS device as claimed in claim 1 further comprising at least one isolation trench interposed between said first structure and said frame structure, said isolation trench electrically isolating said frame structure from said first structure.

8. A MEMS device as claimed in claim 1 wherein said signal trace comprises:
   a trace structure having an insulating layer and a conductive layer;

a first via at a first end of said trace structure, said first via electrically coupling said frame structure with said conductive layer; and a second via at a second end of said trace structure, said second via electrically coupling said anchor element with said conductive layer, and said insulating layer being interposed between said first structure and said conductive layer.

9. A MEMS device as claimed in claim 1 wherein said first structure includes an aperture extending through said body, and said anchor element resides within said aperture and is sized such that a gap region is formed between outer side surfaces of said anchor element and inner side surfaces of said body.

10. A MEMS device as claimed in claim 9 further comprising a compliant member residing in said gap region and interconnected between said anchor element and said body of said first structure, said compliant member being electrically connected to each of said anchor element, and said signal trace and said compliant member being electrically isolated from said body of said first structure.

11. A MEMS device as claimed in claim 1 further comprising an isolation ring surrounding said anchor element extending through said body, said isolation ring electrically isolating said anchor element from said first structure.

12. A MEMS device as claimed in claim 1 wherein said pair of fixed fingers is a first pair of fixed fingers, said fixed fingers includes a second pair of fixed fingers, said movable finger is a first movable finger, and said frame structure further comprises:

isolation trenches extending through said frame structure to form a first mass section and a second mass section of said frame structure, said second mass section being electrically isolated from said first mass section by said isolation trenches, said first movable finger extending inwardly from said inner periphery of said first mass section; and a second movable finger extending inwardly from said inner periphery of said second mass section, said second movable finger being disposed between said second pair of fixed fingers.

13. A microelectromechanical systems (MEMS) device comprising:

a substrate;

a first structure including a body and fixed fingers extending outwardly from an outer periphery of said body, wherein a central area of said body is coupled to said substrate and a remainder of said first structure is suspended over said substrate;

a frame structure surrounding said first structure and suspended over said substrate, said frame structure being movably coupled to said first structure, said frame structure including a movable finger extending inwardly from an inner periphery of said frame structure, said movable finger being disposed between a pair of said fixed fingers;

a plurality of isolation trenches extending through said first structure, wherein at least one of said isolation trenches electrically isolates a first fixed finger of said pair from a second fixed finger of said pair of fixed fingers, and at least another of said isolation trenches electrically isolates said frame structure from said first structure;

an anchor element extending through said body of said first structure and coupled to said substrate; and a signal trace electrically connecting said frame structure to said anchor element, and said frame structure, said signal trace, and said anchor element being electrically isolated from said first structure.

14. A MEMS device as claimed in claim 13 wherein said anchor element is a first anchor element, said signal trace is a first signal trace, and said MEMS device further comprises:

a second anchor element extending through said body of said first structure proximate said central area and coupled to said substrate;

a second signal trace electrically connecting said first fixed finger to said second anchor element;

a third anchor element extending through said body of said first structure proximate said central area and coupled to said substrate; and a third signal trace electrically connecting said second fixed finger to said third anchor element, wherein said third anchor element and said third signal trace are electrically isolated from said second anchor element and said second signal trace.

15. A MEMS device as claimed in claim 13 wherein said at least one of said isolation trenches extends through said first structure between said body and said fixed fingers such that each of said fixed fingers is laterally anchored to one of said isolation trenches.

16. A MEMS device as claimed in claim 13 wherein said pair of fixed fingers is a first pair of fixed fingers, said fixed fingers includes a second pair of fixed fingers, said movable finger is a first movable finger, and said frame structure further comprises:

isolation trenches extending through said frame structure to form a first mass section and a second mass section of said frame structure, said second mass section being electrically isolated from said first mass section by said isolation trenches, said first movable finger extending inwardly from said inner periphery of said first mass section; and a second movable finger extending inwardly from said inner periphery of said second mass section, said second movable finger being disposed between said second pair of fixed fingers.

17. A MEMS device as claimed in claim 16 wherein said anchor element is a first anchor element, said signal trace is a first signal trace, and said MEMS device further comprises:

a second anchor element extending through said body of said first structure proximate said central area and coupled to said substrate;

a second signal trace electrically connecting each of said first fixed finger and a third fixed finger of said second pair of fixed fingers to said second anchor element;

a third anchor element extending through said body of said first structure proximate said central area and coupled to said substrate; and a third signal trace electrically connecting each of said second fixed finger and a fourth fixed finger of said second pair of fixed fingers to said third anchor element, wherein said third anchor element and said third signal trace are electrically isolated from said second anchor element and said second signal trace.

18. A microelectromechanical systems (MEMS) device comprising:

a substrate;

a first structure including a body and fixed fingers extending outwardly from an outer periphery of said body, wherein a central area of said body is coupled to said substrate and a remainder of said first structure is suspended over said substrate, and said first structure further includes an aperture extending through said body;

a frame structure surrounding said first structure and suspended over said substrate, said frame structure being movably coupled to said first structure, said frame structure including a movable finger extending inwardly from an inner periphery of said frame structure, said movable finger being disposed between a pair of said fixed fingers;

an anchor element residing within said aperture and extending through said body to couple to said substrate, said anchor element being sized such that a gap region is formed between outer side surfaces of said anchor element and inner side surfaces of said body; and a signal trace electrically connecting said frame structure to said anchor element, said signal trace including:
  a trace structure having an insulating layer and a conductive layer;
  a first via at a first end of said trace structure, said first via electrically coupling said frame structure with said conductive layer; and
  a second via at a second end of said trace structure, said second via electrically coupling said anchor element with said conductive layer, and said insulating layer being interposed between said first structure and said conductive layer such that frame structure, said signal trace, and said anchor element are electrically isolated from said first structure.

19. A MEMS device as claimed in claim 18 further comprising a compliant member residing in said gap region and interconnected between said anchor element and said body of said first structure, said compliant member being electrically connected to each of said anchor element and said signal trace, and said compliant member being electrically isolated from said first structure.

20. A MEMS device as claimed in claim 18 wherein said anchor element is a first anchor element, said signal trace is a first signal trace, and said MEMS device further comprises:
  at least one isolation trench extending through said first structure, said at least one isolation trench electrically isolating a first fixed finger from a second fixed finger of said pair of fixed fingers;
  a second anchor element extending through said body of said first structure proximate said central area and coupled to said substrate;
  a second signal trace electrically connecting said first fixed finger to said second anchor element;
  a third anchor element extending through said body of said first structure proximate said central area and coupled to said substrate; and
  a third signal trace electrically connecting said second fixed finger to said third anchor element, wherein said third anchor element and said third signal trace are electrically isolated from said second anchor element and said second signal trace.

* * * * *